United States Patent
Subramanian et al.

(10) Patent No.: US 11,755,909 B2
(45) Date of Patent: Sep. 12, 2023

(54) METHOD OF AND SYSTEM FOR TRAINING MACHINE LEARNING ALGORITHM TO GENERATE TEXT SUMMARY

(71) Applicant: ServiceNow Canada Inc., Montreal (CA)

(72) Inventors: Sandeep Subramanian, Montreal (CA); Raymond Li, Montreal (CA); Christopher Pal, Montreal (CA); Jonathan Pilault, Montreal (CA)

(73) Assignee: ServiceNow Canada Inc., Montreal (CA)

( * ) Notice: Subject to any disclaimer, the term of this patent is extended or adjusted under 35 U.S.C. 154(b) by 0 days.

(21) Appl. No.: 17/805,758

(22) Filed: Jun. 7, 2022

(65) Prior Publication Data
US 2022/0366251 A1 Nov. 17, 2022

Related U.S. Application Data
(63) Continuation of application No. 16/881,477, filed on May 22, 2020, now Pat. No. 11,397,892.

(51) Int. Cl.
*G06N 3/08* (2023.01)
*G06F 40/20* (2020.01)
(Continued)

(52) U.S. Cl.
CPC .............. *G06N 3/08* (2013.01); *G06F 40/166* (2020.01); *G06F 40/20* (2020.01); *G06F 16/345* (2019.01);
(Continued)

(58) Field of Classification Search
CPC .......... G06N 3/08; G06N 5/025; G06N 3/048; G06N 3/044; G06N 3/045; G06F 40/166;
(Continued)

(56) References Cited

U.S. PATENT DOCUMENTS

| | | |
|---|---|---|
| 9,916,309 B2 | 3/2018 | Mani |
| 10,013,404 B2 | 7/2018 | Clark |

(Continued)

OTHER PUBLICATIONS

"A Neural Attention Model for Abstractive Sentence Summarization" by RUSH et al. Total 11 pages (Year: 2015).*
(Continued)

*Primary Examiner* — Quoc A Tran
(74) *Attorney, Agent, or Firm* — FASKEN MARTINEAU DUMOULIN LLP; Serge Lapointe

(57) ABSTRACT

There is provided a method and a system for training an extractive machine learning algorithm (MLA) to generate extractive summaries of text documents. Reference documents and associated extractive summaries are received. The extractive MLA is then trained to generate an extractive summary, where the training includes, for a given reference document, encoding, using a sentence encoder, a plurality of reference sentences to obtain an associated plurality of sentence representations, encoding, using a document encoder, the associated plurality of sentence representations to obtain a document representation, extracting, using a decoder and based on the associated plurality of sentence representations and the document representation, a first reference sentence of the plurality of reference sentences to obtain a first extracted sentence. A given parameter is updated based on the first extracted sentence and the given reference document summary. A trained extractive MLA comprising the updated given parameter is output.

20 Claims, 8 Drawing Sheets

(51) Int. Cl.
   *G06F 40/166*  (2020.01)
   *G06F 40/216*  (2020.01)
   *G06F 16/34*   (2019.01)
   *G06F 40/30*   (2020.01)
   *G06F 30/27*   (2020.01)
   *G06N 5/025*   (2023.01)
   *G06F 40/103*  (2020.01)
   *G06F 17/00*   (2019.01)

(52) U.S. Cl.
   CPC ............ *G06F 30/27* (2020.01); *G06F 40/103* (2020.01); *G06F 40/216* (2020.01); *G06F 40/30* (2020.01); *G06N 5/025* (2013.01)

(58) Field of Classification Search
   CPC ........ G06F 40/20; G06F 16/345; G06F 30/27; G06F 40/103; G06F 40/216; G06F 40/30
   See application file for complete search history.

(56) References Cited

U.S. PATENT DOCUMENTS

| | | | |
|---|---|---|---|
| 10,229,111 | B1 | 3/2019 | Fillippova |
| 10,387,550 | B2 | 8/2019 | Simske |
| 10,445,356 | B1 | 10/2019 | Mugan |
| 11,394,799 | B2 † | 7/2022 | Jackson |
| 2017/0213130 | A1 | 7/2017 | Khatri |
| 2018/0150905 | A1 | 5/2018 | Lee |
| 2019/0042551 | A1* | 2/2019 | Hwang .................. G06N 3/045 |
| 2019/0130273 | A1 | 5/2019 | Keskar |
| 2019/0155910 | A1 | 5/2019 | Dockhorn |
| 2020/0159755 | A1* | 5/2020 | Iida ........................ G06F 40/30 |
| 2020/0257757 | A1* | 8/2020 | Chawla .................. G06F 40/20 |

OTHER PUBLICATIONS

Rush et al., NPL ("A Neural Attention Model for Abstractive Sentence Summarization" dated Sep. 3, 2015 [hereinafter "Rush"]—Total 11 pages (Year: 2015).*

Wu, Y. et al., "Learning to Extract Coherent Summary via Deep Reinforcement Learning", arXiv.org, v1, pp. 1-8, Apr. 19, 2018 (Apr. 19, 2018).

Esmaeilzadeh, S. et al., "Neural Abstractive Text Summarization and Fake News Detection", arXiv.org, v2, pp. 1-10, Dec. 12, 2019 (Dec. 12, 2019).

Narayan, Shashi, Shay B. Cohen, and Mirella Lapata "Ranking sentences for extractive summarization with reinforcement learning" arXiv preprint arXiv; 1802.08636 (2018), fig.1; p. 2, right column; p. 6,right column, the last paragraph.

Subramanian, Sandeep, et al. "On extractive and abstractive neural document summarization with transformer language models" arXiv preprint arXiv: 1909.03186(2019), fig. 1; p. 3, left column, pars. 2 and 6; p. 3, sentence pointer and classifier.

You, Yongjian et al., Improving Abstractive Document Summarization with Salient Information Modeling, Proceedings of the 57th Annual Meeting of the Association for Computational Linguistics, pp. 2132-2141, Florence, Italy, Jul. 28-Aug. 2, 2019.

Liu, Peter J. et al., Generating Wikipedia by summarizing long sequences, Published as a conference paper at ICLR 2018, Jan. 30, 2018, arXiv preprint arXiv:1801.10198.

Liu, Yang, Fine-tune BERT for Extractive Summarization, Sep. 5, 2019, arXiv preprint arXiv: 1903.10318.

Nallapati, Ramesh et al., SummaruNNer: A recurrent neural network based sequence model for extractive summarization of documents, Thirty-First AAAI Conference on Artificial Intelligence (AAAI-17), Feb. 12, 201.

Ott, Myle et al., FAIRSEQ: A Fast, Extensible Toolkit for Sequence Modeling, Apr. 1, 2019, arXiv preprint arXiv:1904.01038.

Wei, Ran, Heyan Huang, and Yang Gao. "Sharing pre-trained BERT decoder for a hybrid summarization." China National Conference on Chinese Computational Linguistics Springer, Cham, 2019.

\* cited by examiner
† cited by third party

METHOD OF AND SYSTEM FOR TRAINING MACHINE LEARNING ALGORITHM TO GENERATE TEXT SUMMARY

CROSS-REFERENCE TO RELATED APPLICATIONS

The present application is a continuation of U.S. patent application Ser. No. 16/881,477 filed on Nov. 25, 2021, which is herein incorporated by reference in its entirety.

FIELD

The present technology relates to machine learning algorithms (MLAs) and natural language processing (NLP) in general, and more specifically to a method of and a system for training one or more machine learning algorithms to generate extractive and abstractive summaries of documents.

BACKGROUND

Improvements in computer hardware and technology coupled with the multiplication of connected mobile electronic devices have spiked interest in developing solutions for task automatization, outcome prediction, information classification and learning from experience, resulting in the field of machine learning. Machine learning, closely related to data mining, computational statistics and optimization, explores the study and construction of algorithms that can learn from and make predictions on data.

The field of machine learning has evolved extensively in the last decade, giving rise to self-driving cars, speech recognition, image recognition, personalization, and understanding of the human genome. In addition, machine learning enhances different information retrieval activities, such as document searching, collaborative filtering, sentiment analysis, and so forth.

Machine learning algorithms (MLAs) may generally be divided into broad categories such as supervised learning, unsupervised learning and reinforcement learning. Supervised learning consists of presenting a machine learning algorithm with training data consisting of inputs and outputs labelled by assessors, where the goal is to train the machine learning algorithm such that it learns a general rule for mapping inputs to outputs. Unsupervised learning consists of presenting the machine learning algorithm with unlabeled data, where the goal is for the machine learning algorithm to find a structure or hidden patterns in the data. Reinforcement learning consists of having an algorithm evolving in a dynamic environment without providing the algorithm with labeled data or corrections.

In the context of natural language processing (NLP), automatic summarization is the process of shortening a set of data computationally, to create a subset or summary that represents the most important or relevant information within the original content.

Generally speaking, two approaches exist in automatic document summarization: extractive summarization and abstractive summarization. Extractive summarization consists in extracting content from the original data without any modification, where the most relevant phrases in a document are selected to output a summary. Abstractive summarization consists in using an internal semantic representation of the original data and creating a summary by paraphrasing information in the original data, which mimics the work of a human summarizer.

Human summarizers have four common characteristics, they are able to (1) interpret a source document, (2) prioritize the most important parts of the input text, (3) paraphrase key concepts into coherent paragraphs and (4) generate diverse output summaries. While extractive methods are arguably well suited for identifying the most relevant information, such techniques may lack the fluency and coherency of human generated summaries. Abstractive summarization has shown the most promise towards addressing points (3) and (4) above.

SUMMARY

It is an object of one or more embodiments of the present technology to improve at least one of the limitations present in the prior art. One or more embodiments of the present technology may provide and/or broaden the scope of approaches to and/or methods of achieving the aims and objects of the present technology.

Developers of the present technology have appreciated that sequence-to-sequence (seq2seq) paradigms, which use language models that learn the conditional probability of one sentence given another using encoder-decoder architectures have been successful when applied to problems such as machine translation and abstractive summarization. The encoder and conditional decoder language models are often parameterized as recurrent neural networks (RNNs). Attention mechanisms are used in the decoder to provide more informative conditioning on the representations produced by the encoder and to ease gradient flow into the encoder.

Developers have appreciated that in some instances, recurrent neural network (RNNs) are limited by their sequential nature, making them difficult to optimize and learn for long sequences with long range dependencies and hard to parallelize on modern hardware like GPUs, limiting their scalability.

Feedforward architectures such as convolutional models, or fully attentive models, also known as transformers, have been proven to be useful for document summarization. These techniques have a logarithmic or constant path length (as opposed to linear path length in RNNs) between a network's output and any of its inputs, making gradient flow much easier, thereby opening up the possibility of learning very long term dependencies.

Unlike most previous approaches to neural abstractive summarization, a seq2seq formulation with an explicit encoder and decoder for word generation may not process longer documents having thousands of words as efficiently as shorter documents due to variety of factors, such as required memory and processing by the seq2seq.

Thus, developers have envisioned that the summarization task may be split in two parts: an extractive step and an abstractive step. To deal with extremely long documents that exceed several thousand words, sentence extraction may be performed using two different hierarchical document models—one based on pointer networks and the other based on a sentence classifier. Such an extractive step can be used to better condition the transformer LM on relevant information before being tasked with generating a summary, which improves summarization results of the transformer LM.

Thus, one or more embodiments of the present technology are directed to a method and a system for training one or more machine learning algorithms (MLAs) to generate text summaries.

In accordance with a broad aspect of the present technology, there is disclosed a method for training an extractive machine learning algorithm (MLA) to generate extractive summaries, the method being executed by a processor, the processor having access to the extractive MLA. The method includes: receiving a reference document, the reference document comprising a plurality of reference text sequences, receiving a reference summary of the reference document, the reference summary comprising a set of reference summary text sequences, the set of reference summary text sequences being a subset of the plurality of reference text sequences, training the extractive MLA to generate an extractive summary, said training comprising: encoding, using the extractive MLA, the plurality of reference text sequences to obtain an associated plurality of reference text sequence representations, extracting, using the extractive MLA and based on the associated plurality of reference text sequence representations, a first reference text sequence of the plurality of reference text sequences to obtain a first extracted text sequence of the extractive summary. The method includes updating, based on the first extracted text sequence and the set of reference summary text sequences, a given parameter of the extractive MLA to obtain an updated given parameter, and outputting the trained extractive MLA, the trained extractive MLA comprising the updated given parameter.

In one or more embodiments of the method, the method further includes, prior to receiving the reference summary of the reference document, the reference summary comprising the set of reference summary text sequences: receiving a first summary of the reference document, the first summary comprising a set of first summary text sequences, at least one first summary text sequence not being included in the plurality of reference text sequences. determining a respective similarity score between the at least one first summary text sequence and at least one reference text sequence of the plurality of reference text sequences. The method includes extracting, based on the respective similarity score, the at least one reference text sequence of the plurality of reference text sequences to obtain the reference summary of the reference document.

In one or more embodiments of the method, the respective similarity score includes a Recall-Oriented Understudy for Gisting Evaluation (ROUGE) metric.

In one or more embodiments of the method, the method further includes prior to said receiving the reference document comprising the plurality of reference text sequences: receiving a size of the plurality of reference text sequences, and said receiving the reference document comprising the plurality of reference text sequences is in response to the size of the plurality of reference text sequences being above a predetermined threshold.

In one or more embodiments of the method, the extractive MLA includes an encoder and a decoder, and said encoding the plurality of reference text sequences to obtain the associated plurality of reference text sequence representations is performed using the encoder, and said extracting based on the associated plurality of text sequence representations, the first reference text sequence of the plurality of reference text sequences to obtain the first extracted text sequence of the extractive summary is performed using the decoder.

In one or more embodiments of the method, the encoder includes a long short term memory (LSTM) network.

In one or more embodiments of the method, the method further includes, prior to said encoding the plurality of reference text sequences to obtain the associated plurality of text sequence representations: embedding, using the encoder of the extractive MLA, the plurality of reference text sequences to obtain a plurality of reference text sequence vectors, and said encoding the plurality of reference text sequences to obtain the associated plurality of text sequence representations is based on the plurality of reference text sequence vectors.

In one or more embodiments of the method, the decoder includes a classifier.

In one or more embodiments of the method, said extracting based on the associated plurality of reference text sequence representations the first extracted text sequence is performed by the classifier.

In one or more embodiments of the method, the decoder includes a further LSTM.

In one or more embodiments of the method, the method further includes, after said extracting, using the extractive MLA, based on the associated plurality of reference text sequence representations, the first extracted text sequence of the set of reference summary text sequences: extracting, using the decoder, based on the first extracted text sequence and the associated plurality of text sequence representations, a second first reference text sequence of the plurality of reference text sequences to obtain a second extracted text sequence of the extractive summary In one or more embodiments of the method, said generating is performed recursively.

In one or more embodiments of the method, the decoder includes a hidden state, the hidden state comprising the first extracted text sequence and the associated plurality of text sequence representations, and said extracting includes using an attention mechanism on the hidden state of the decoder to obtain the extractive summary comprising the first extracted text sequence and the second extracted text sequence.

In one or more embodiments of the method, each of the plurality of reference text sequences has a respective position, and said extracting is based on the respective position.

In accordance with a broad aspect of the present technology, there is disclosed a method of training an abstractive MLA, the processor having access to the abstractive MLA. The method includes: receiving a further document, the further document having a plurality of further text sequences, receiving a further abstractive summary of the further document, the further abstractive summary comprising a set of further abstractive summary text sequences, extracting, using the trained extractive MLA, a set of further extractive summary text sequences from the plurality of further text sequences to obtain a further extractive summary, training an abstractive MLA to generate the further abstractive summary, said training comprising: conditioning the abstractive MLA to generate the set of further abstractive summary text sequences based on the set of further extractive summary text sequences. The method includes outputting a trained abstractive MLA.

In one or more embodiments of the method, said conditioning the abstractive MLA to generate the set of further abstractive summary text sequences based on the set of further extractive summary text sequences is further based on at least a portion of the plurality of further text sequences.

In one or more embodiments of the method, the abstractive MLA includes a transformer language model.

In one or more embodiments of the method, the abstractive MLA includes a recurrent neural network (RNN).

In accordance with a broad aspect of the present technology, there is disclosed a method of generating an abstractive summary. The method includes: receiving an other document, the other document comprising a plurality of other text sequences, extracting, using the trained extractive MLA, a set of other extractive summary text sequences from plurality of other text sequences to obtain an other extractive summary. The method includes generating, using the trained abstractive MLA, based on at least the set of other extractive summary text sequences, an other abstractive summary of the other document, the other abstractive summary comprising a set of other abstractive summary text sequences.

In accordance with a broad aspect of the present technology, there is disclosed a method of generating an abstractive summary of a document, the method being executed by a processor, the processor having access to an abstractive machine learning algorithm (MLA) having been trained to generate abstractive summaries of documents based on extractive summaries thereof. The method includes: receiving the document, the document comprising a plurality of text sequences, generating an extractive summary of the document, the extractive summary comprising a set of summary text sequences, the set of summary text sequences being a subset of the plurality of text sequences, generating, by the abstractive MLA, based on the set of summary text sequences and at least a portion of the plurality of text sequences, an abstractive summary of the document comprising a set of abstractive text sequences, at least one abstractive text sequence not being included in the plurality of text sequences.

In one or more embodiments of the method, said generating the extractive summary of the document includes: receiving a first summary of the document, the first summary comprising a set of first summary text sequences, at least one first summary text sequence not being included in the plurality of text sequences. determining a respective similarity score between the at least one first summary text sequence and at least one text sequence of the plurality of text sequences. The method includes extracting, based on the respective similarity score, the at least one text sequence of the plurality of text sequences to obtain the extractive summary of the document.

In one or more embodiments of the method, the processor has access to an extractive MLA having been trained to generate extractive summaries of documents, and said generating the extractive summary of the document includes: encoding, using the extractive MLA, the plurality of text sequences to obtain an associated plurality of text sequence representations, extracting, using the extractive MLA and based on the associated plurality of text sequence representations, the set of summary text sequences.

In one or more embodiments of the method, the abstractive MLA includes a transformer language model (TLM).

In one or more embodiments of the method, the extractive MLA includes one of a sentence pointer network and a classifier.

In accordance with a broad aspect of the present technology, there is disclosed a system for training an extractive machine learning algorithm (MLA) to generate extractive summaries, the system comprising: a processor, a non-transitory storage medium operatively connected to the processor, the non-transitory storage medium comprising computer readable instructions, the processor having access to the extractive MLA, the processor, upon executing the computer readable instructions, being configured for: receiving a reference document, the reference document comprising a plurality of reference text sequences, receiving a reference summary of the reference document, the reference summary comprising a set of reference summary text sequences, the set of reference summary text sequences being a subset of the plurality of reference text sequences, training the extractive MLA to generate an extractive summary, said training comprising: encoding, using the extractive MLA, the plurality of reference text sequences to obtain an associated plurality of reference text sequence representations, extracting, using the extractive MLA and based on the associated plurality of reference text sequence representations, a first reference text sequence of the plurality of reference text sequences to obtain a first extracted text sequence of the extractive summary. The processor is configured for updating, based on the first extracted text sequence and the set of reference summary text sequences, a given parameter of the extractive MLA to obtain an updated given parameter; and outputting the trained extractive MLA, the trained extractive MLA comprising the updated given parameter.

In one or more embodiments of the system, the processor is further configured for, prior to receiving the reference summary of the reference document, the reference summary comprising the set of reference summary text sequences: receiving a first summary of the reference document, the first summary comprising a set of first summary text sequences, at least one first summary text sequence not being included in the plurality of reference text sequences. determining a respective similarity score between the at least one first summary text sequence and at least one reference text sequence of the plurality of reference text sequences, and extracting, based on the respective similarity score, the at least one reference text sequence of the plurality of reference text sequences to obtain the reference summary of the reference document.

In one or more embodiments of the system, the respective similarity score includes a Recall-Oriented Understudy for Gisting Evaluation (ROUGE) metric.

In one or more embodiments of the system, the processor is further configured for, prior to said receiving the reference document comprising the plurality of reference text sequences: receiving a size of the plurality of reference text sequences, and said receiving the reference document comprising the plurality of reference text sequences is in response to the size of the plurality of reference text sequences being above a predetermined threshold.

In one or more embodiments of the system, the extractive MLA includes an encoder and a decoder, and said encoding the plurality of reference text sequences to obtain the associated plurality of reference text sequence representations is performed using the encoder, and said extracting based on the associated plurality of text sequence representations, the first reference text sequence of the plurality of reference text sequences to obtain the first extracted text sequence of the extractive summary is performed using the decoder.

In one or more embodiments of the system, the encoder includes a long short term memory (LSTM) network.

In one or more embodiments of the system, the processor is further configured for, prior to said encoding the plurality of reference text sequences to obtain the associated plurality of text sequence representations: embedding, using the encoder of the extractive MLA, the plurality of reference text sequences to obtain a plurality of reference text sequence vectors, and
said encoding the plurality of reference text sequences to obtain the associated plurality of text sequence representations is based on the plurality of reference text sequence vectors.

In one or more embodiments of the system, the decoder includes a classifier.

In one or more embodiments of the system, said extracting based on the associated plurality of reference text sequence representations the first extracted text sequence is performed by the classifier.

In one or more embodiments of the system, the decoder includes a further LSTM.

In one or more embodiments of the system, the processor is further configured for, after said extracting, using the extractive MLA, based on the associated plurality of reference text sequence representations, the first extracted text sequence of the set of reference summary text sequences: extracting, using the decoder, based on the first extracted text sequence and the associated plurality of text sequence representations, a second first reference text sequence of the plurality of reference text sequences to obtain a second extracted text sequence of the extractive summary In one or more embodiments of the system, said generating is performed recursively.

In one or more embodiments of the system, the decoder includes a hidden state, the hidden state comprising the first extracted text sequence and the associated plurality of text sequence representations, and said extracting includes using an attention mechanism on the hidden state of the decoder to obtain the extractive summary comprising the first extracted text sequence and the second extracted text sequence.

In one or more embodiments of the system, each of the plurality of reference text sequences has a respective position, and said extracting is based on the respective position.

In accordance with a broad aspect of the present technology, there is disclosed a system of training an abstractive MLA, the system comprising: a processor and a non-transitory storage medium operatively connected to the processor, the non-transitory storage medium comprising computer readable instructions, the processor having access to the abstractive MLA, the processor, upon executing the computer readable instructions, being configured for: receiving a further document, the further document having a plurality of further text sequences, receiving a further abstractive summary of the further document, the further abstractive summary comprising a set of further abstractive summary text sequences, extracting, using the trained extractive MLA, a set of further extractive summary text sequences from the plurality of further text sequences to obtain a further extractive summary, training an abstractive MLA to generate the further abstractive summary, said training comprising: conditioning the abstractive MLA to generate the set of further abstractive summary text sequences based on the set of further extractive summary text sequences, and outputting a trained abstractive MLA.

In one or more embodiments of the system, said conditioning the abstractive MLA to generate the set of further abstractive summary text sequences based on the set of further extractive summary text sequences is further based on at least a portion of the plurality of further text sequences.

In one or more embodiments of the system, the abstractive MLA includes a transformer language model.

In one or more embodiments of the system, the abstractive MLA includes a recurrent neural network (RNN).

In accordance with a broad aspect of the present technology, there is disclosed a system of generating an abstractive summary, the system comprising: a processor and a non-transitory storage medium operatively connected to the processor, the non-transitory storage medium comprising computer readable instructions. The processor, upon executing the computer readable instructions, being configured for: receiving an other document, the other document comprising a plurality of other text sequences, extracting, using the trained extractive MLA, a set of other extractive summary text sequences from plurality of other text sequences to obtain an other extractive summary, and generating, using the trained abstractive MLA, based on at least the set of other extractive summary text sequences, an other abstractive summary of the other document, the other abstractive summary comprising a set of other abstractive summary text sequences.

In accordance with a broad aspect of the present technology, there is disclosed a system for generating an abstractive summary of a document, the system comprising: a processor, a non-transitory storage medium operatively connected to the processor, the non-transitory storage medium comprising computer readable instructions, the processor having access to an abstractive machine learning algorithm (MLA) having been trained to generate abstractive summaries of documents based on extractive summaries thereof, the processor, upon executing the computer readable instructions, being configured for: receiving the document, the document comprising a plurality of text sequences, generating an extractive summary of the document, the extractive summary comprising a set of summary text sequences, the set of summary text sequences being a subset of the plurality of text sequences, generating, by the abstractive MLA, based on the set of summary text sequences and at least a portion of the plurality of text sequences, an abstractive summary of the document comprising a set of abstractive text sequences, at least one abstractive text sequence not being included in the plurality of text sequences.

In one or more embodiments of the system, said generating the extractive summary of the document includes: receiving a first summary of the document, the first summary comprising a set of first summary text sequences, at least one first summary text sequence not being included in the plurality of text sequences, determining a respective similarity score between the at least one first summary text sequence and at least one text sequence of the plurality of text sequences, and extracting, based on the respective similarity score, the at least one text sequence of the plurality of text sequences to obtain the extractive summary of the document.

In one or more embodiments of the system, the processor has access to an extractive MLA having been trained to generate extractive summaries of documents, and said generating the extractive summary of the document includes: encoding, using the extractive MLA, the plurality of text sequences to obtain an associated plurality of text sequence representations, extracting, using the extractive MLA and based on the associated plurality of text sequence representations, the set of summary text sequences.

In one or more embodiments of the system, the abstractive MLA includes a transformer language model (TLM).

In one or more embodiments of the system, the extractive MLA includes one of a sentence pointer network and a classifier.

Definitions

In the context of the present specification, a "server" is a computer program that is running on appropriate hardware and is capable of receiving requests (e.g., from electronic devices) over a network (e.g., a communication network), and carrying out those requests, or causing those requests to be carried out. The hardware may be one physical computer or one physical computer system, but neither is required to be the case with respect to the present technology. In the present context, the use of the expression a "server" is not intended to mean that every task (e.g., received instructions or requests) or any particular task will have been received, carried out, or caused to be carried out, by the same server (i.e., the same software and/or hardware); it is intended to mean that any number of software elements or hardware devices may be involved in receiving/sending, carrying out or causing to be carried out any task or request, or the consequences of any task or request; and all of this software and hardware may be one server or multiple servers, both of which are included within the expressions "at least one server" and "a server".

In the context of the present specification, "electronic device" is any computing apparatus or computer hardware that is capable of running software appropriate to the relevant task at hand. Thus, some (non-limiting) examples of electronic devices include general purpose personal computers (desktops, laptops, netbooks, etc.), mobile computing devices, smartphones, and tablets, and network equipment such as routers, switches, and gateways. It should be noted that an electronic device in the present context is not precluded from acting as a server to other electronic devices. The use of the expression "an electronic device" does not preclude multiple electronic devices being used in receiving/sending, carrying out or causing to be carried out any task or request, or the consequences of any task or request, or steps of any method described herein. In the context of the present specification, a "client device" refers to any of a range of end-user client electronic devices, associated with a user, such as personal computers, tablets, smartphones, and the like.

In the context of the present specification, the expression "computer readable storage medium" (also referred to as "storage medium" and "storage") is intended to include non-transitory media of any nature and kind whatsoever, including without limitation RAM, ROM, disks (CD-ROMs, DVDs, floppy disks, hard drivers, etc.), USB keys, solid state-drives, tape drives, etc. A plurality of components may be combined to form the computer information storage media, including two or more media components of a same type and/or two or more media components of different types.

In the context of the present specification, a "database" is any structured collection of data, irrespective of its particular structure, the database management software, or the computer hardware on which the data is stored, implemented or otherwise rendered available for use. A database may reside on the same hardware as the process that stores or makes use of the information stored in the database or it may reside on separate hardware, such as a dedicated server or plurality of servers.

In the context of the present specification, the expression "information" includes information of any nature or kind whatsoever capable of being stored in a database. Thus information includes, but is not limited to audiovisual works (images, movies, sound records, presentations etc.), data (location data, numerical data, etc.), text (opinions, comments, questions, messages, etc.), documents, spreadsheets, lists of words, etc.

In the context of the present specification, unless expressly provided otherwise, an "indication" of an information element may be the information element itself or a pointer, reference, link, or other indirect mechanism enabling the recipient of the indication to locate a network, memory, database, or other computer-readable medium location from which the information element may be retrieved. For example, an indication of a document may include the document itself (i.e. its contents), or it may be a unique document descriptor identifying a file with respect to a particular file system, or some other means of directing the recipient of the indication to a network location, memory address, database table, or other location where the file may be accessed. As one skilled in the art will appreciate, the degree of precision required in such an indication depends on the extent of any prior understanding about the interpretation to be given to information being exchanged as between the sender and the recipient of the indication. For example, if it will be appreciated that prior to a communication between a sender and a recipient that an indication of an information element will take the form of a database key for an entry in a particular table of a predetermined database containing the information element, then the sending of the database key is all that is required to effectively convey the information element to the recipient, even though the information element itself was not transmitted as between the sender and the recipient of the indication.

In the context of the present specification, the expression "communication network" is intended to include a telecommunications network such as a computer network, the Internet, a telephone network, a Telex network, a TCP/IP data network (e.g., a WAN network, a LAN network, etc.), and the like. The term "communication network" includes a wired network or direct-wired connection, and wireless media such as acoustic, radio frequency (RF), infrared and other wireless media, as well as combinations of any of the above.

In the context of the present specification, the words "first", "second", "third", etc. have been used as adjectives only for the purpose of allowing for distinction between the nouns that they modify from one another, and not for the purpose of describing any particular relationship between those nouns. Thus, for example, it will be appreciated that, the use of the terms "server" and "third server" is not intended to imply any particular order, type, chronology, hierarchy or ranking (for example) of/between the server, nor is their use (by itself) intended imply that any "second server" must necessarily exist in any given situation. Further, as is discussed herein in other contexts, reference to a "first" element and a "second" element does not preclude the two elements from being the same actual real-world element. Thus, for example, in some instances, a "first" server and a "second" server may be the same software and/or hardware, in other cases they may be different software and/or hardware.

Implementations of the present technology each have at least one of the above-mentioned object and/or aspects, but do not necessarily have all of them. It will be appreciated that some aspects of the present technology that have resulted from attempting to attain the above-mentioned object may not satisfy this object and/or may satisfy other objects not specifically recited herein.

Additional and/or alternative features, aspects and advantages of implementations of one or more embodiments of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
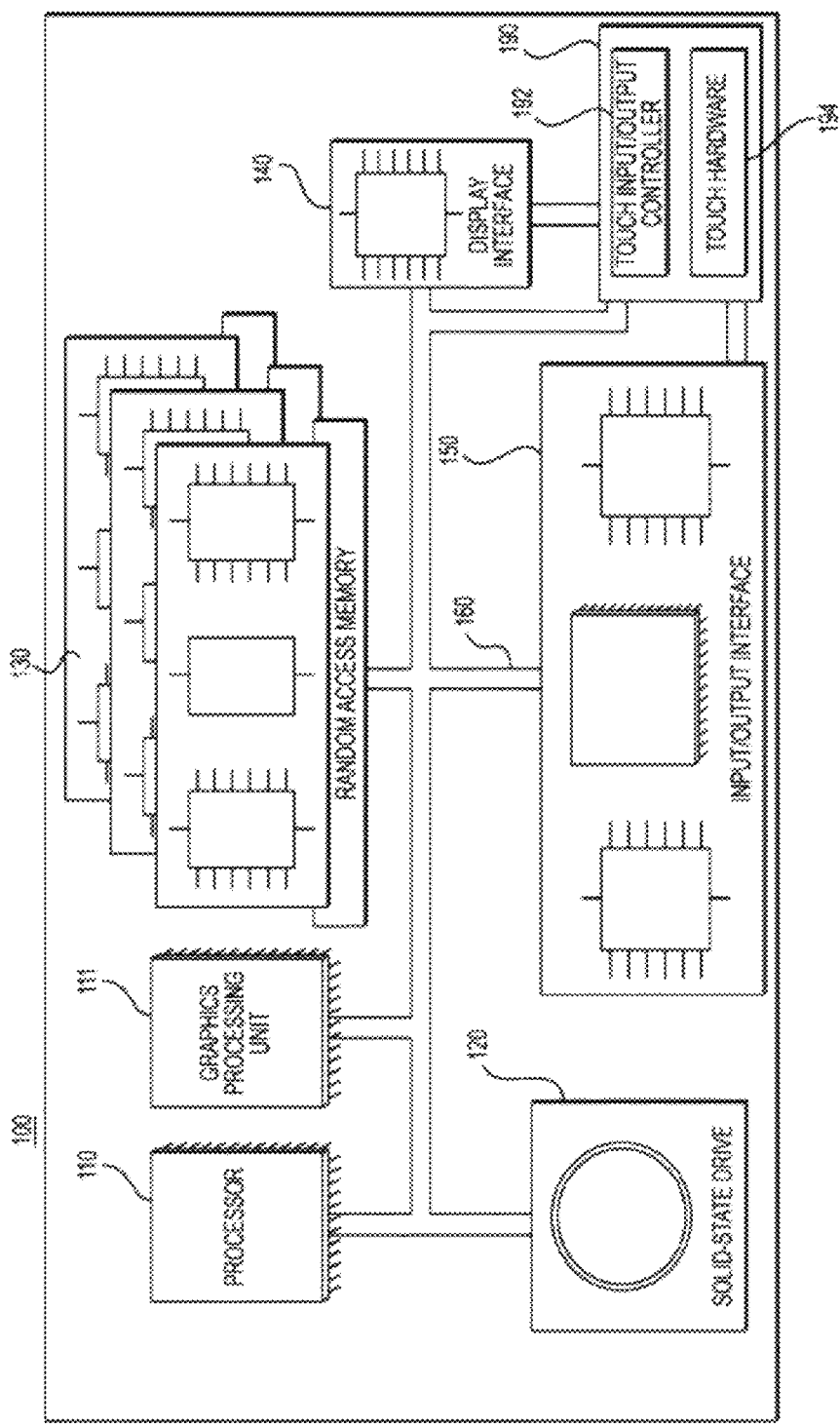
FIG. 1 depicts a schematic diagram of an electronic device in accordance with one or more non-limiting embodiments of the present technology.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology.

Furthermore, as an aid to understanding, the following description may describe relatively simplified implementations of the present technology. As a person skilled in the art will appreciate, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by the skilled addressee that any block diagram herein represents conceptual views of illustrative circuitry embodying the principles of the present technology. Similarly, it will be appreciated that any flowcharts, flow diagrams, state transition diagrams, pseudocode, and the like represent various processes which may be substantially represented in computer-readable media and so executed by a computer or processor, whether or not such computer or processor is explicitly shown.

The functions of the various elements shown in the figures, including any functional block labeled as a "processor" or a "graphics processing unit", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some non-limiting embodiments of the present technology, the processor may be a general purpose processor, such as a central processing unit (CPU) or a processor dedicated to a specific purpose, such as a graphics processing unit (GPU). Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown.

With these fundamentals in place, we will now consider some non-limiting examples to illustrate various implementations of aspects of the present technology.

Electronic Device

Now referring to FIG. 1, there is shown an electronic device 100 suitable for use with one or more implementations of the present technology, the electronic device 100 comprises various hardware components including one or more single or multi-core processors collectively represented by processor 110, a graphics processing unit (GPU) 111, a solid-state drive 120, a random access memory 130, a display interface 140, and an input/output interface 150.

Communication between the various components of the electronic device 100 may be enabled by one or more internal and/or external buses 160 (e.g. a PCI bus, universal serial bus, IEEE 1394 "Firewire" bus, SCSI bus, Serial-ATA bus, etc.), to which the various hardware components are electronically coupled.

The input/output interface 150 may be coupled to a touchscreen 190 and/or to the one or more internal and/or external buses 160. The touchscreen 190 may be part of the display. In one or more embodiments, the touchscreen 190 is the display. The touchscreen 190 may equally be referred to as a screen 190. In the embodiment illustrated in FIG. 1, the touchscreen 190 comprises touch hardware 194 (e.g., pressure-sensitive cells embedded in a layer of a display allowing detection of a physical interaction between a user and the display) and a touch input/output controller 192 allowing communication with the display interface 140 and/or the one or more internal and/or external buses 160. In one or more embodiments, the input/output interface 150 may be connected to a keyboard (not shown), a mouse (not shown) or a trackpad (not shown) enabling the user to interact with the electronic device 100 in addition or in replacement of the touchscreen 190.

According to one or more implementations of the present technology, the solid-state drive 120 stores program instructions suitable for being loaded into the random-access memory 130 and executed by the processor 110 and/or the GPU 111 for training one or more machine learning algorithms to generate extractive and abstractive summaries. For example, the program instructions may be part of a library or an application.

It will be appreciated that the electronic device 100 may be implemented as a server, a desktop computer, a laptop computer, a tablet, a smartphone, a personal digital assistant or any device that may be configured to implement the present technology, as it may be appreciated by a person skilled in the art.

System

Figure 2:
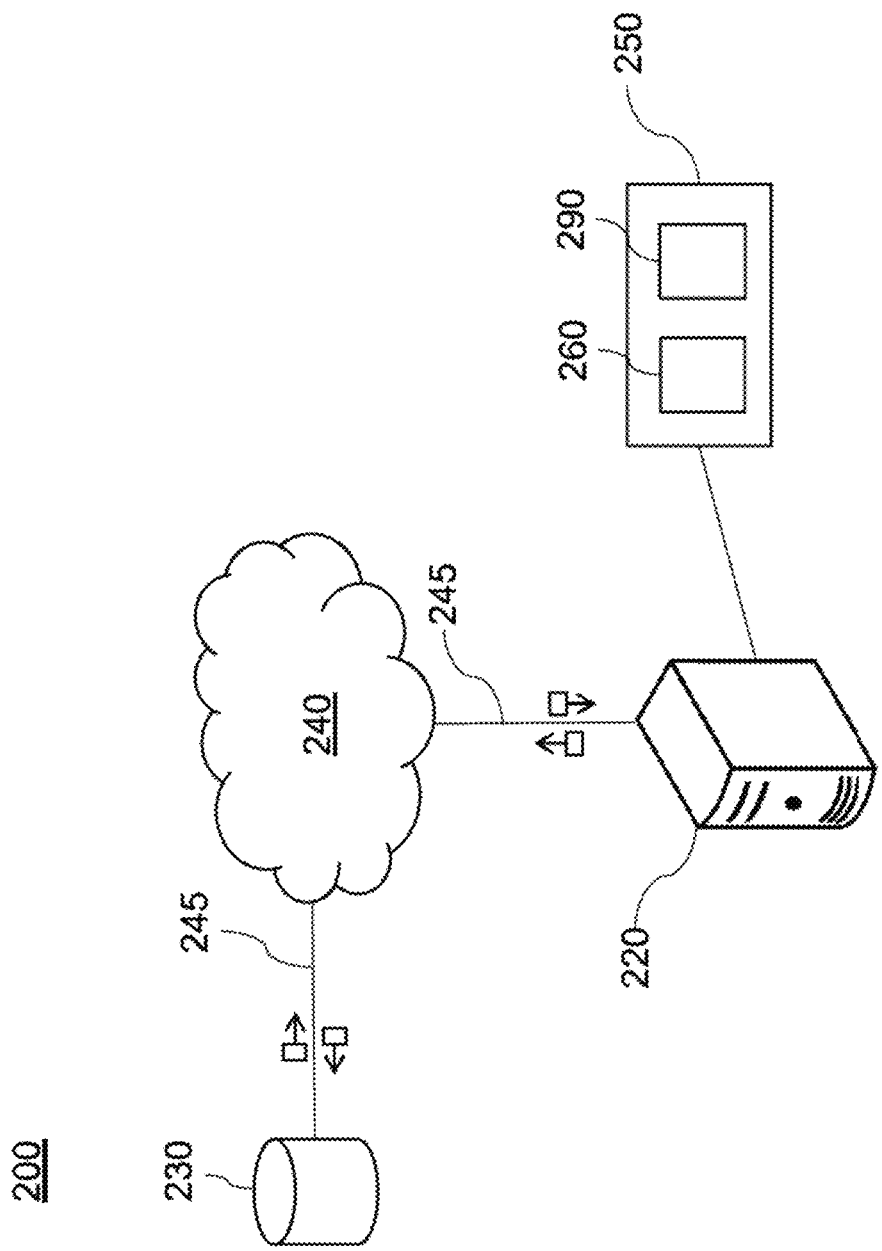
FIG. 2 depicts a schematic diagram of a system in accordance with one or more non-limiting embodiments of the present technology.

Now referring to FIG. 2, there is shown a schematic diagram of a system 200, the system 200 being suitable for implementing one or more non-limiting embodiments of the present technology. It will be appreciated that the system 200 as shown is merely an illustrative implementation of the present technology. Thus, the description thereof that follows is intended to be only a description of illustrative examples of the present technology. In some cases, what are believed to be helpful examples of modifications to the system 200 may also be set forth below. This is done merely as an aid to understanding, and, again, not to define the scope or set forth the bounds of the present technology. These modifications are not an exhaustive list, and, as a person skilled in the art will understand, other modifications are likely possible. Further, where this has not been done (i.e., where no examples of modifications have been set forth), it should not be interpreted that no modifications are possible and/or that what is described is the sole manner of implementing that element of the present technology. As a person skilled in the art will appreciate, this is likely not the case. In addition, it will be appreciated that the system 200 may provide in certain instances simple implementations of one or more embodiments of the present technology, and that where such is the case they have been presented in this manner as an aid to understanding.

The system 200 comprises inter alia a server 220, and a database 230, communicatively coupled over a communications network 240 via respective communication links 245.

Server

The server 220 is configured to: (i) access the set of MLAs 250; (ii) receive documents and summaries of the documents; (iii) train the set of MLAs 250 to generate abstractive and extractive summaries; and (iv) generate extractive and abstractive summaries of documents using the set of MLAs 250.

How the server 220 is configured to do so will be explained in more detail herein below.

It will be appreciated that the server 220 can be implemented as a conventional computer server and may comprise at least some of the features of the electronic device 100 shown in FIG. 1. In a non-limiting example of one or more embodiments of the present technology, the server 220 is implemented as a server running an operating system (OS). Needless to say that the server 220 may be implemented in any suitable hardware and/or software and/or firmware or a combination thereof. In the disclosed non-limiting embodiment of present technology, the server 220 is a single server. In one or more alternative non-limiting embodiments of the present technology, the functionality of the server 220 may be distributed and may be implemented via multiple servers (not shown).

The implementation of the server 220 is well known to the person skilled in the art. However, the server 220 comprises a communication interface (not shown) configured to communicate with various entities (such as the database 230, for example and other devices potentially coupled to the communication network 240) via the communication network 240. The server 220 further comprises at least one computer processor (e.g., the processor 110 of the electronic device 100) operationally connected with the communication interface and structured and configured to execute various processes to be described herein.

Machine Learning Algorithms (MLAs)

The set of MLAs 250 comprises inter alia a set of extractive MLAs 260, and a set of abstractive MLAs 290.

The set of extractive MLAs 260 is configured to inter alia: (i) receive one or more documents; (ii) extract, from the one or more documents, a set of sentences to obtain an extractive summary; and (iii) output the extractive summary comprising the set of important sentences, which will be provided as for training the set of abstractive MLAs 290.

To achieve that purpose, the set of extractive MLAs 260 undergoes a training phase, which will be explained in more detail herein below.

The set of abstractive MLAs 290 is configured to inter alia: (i) receive as an input a document; and (ii) generate an abstractive summary of the document.

To achieve that purpose, the set of abstractive MLAs 290 undergoes a training procedure by being trained on extractive summaries of documents generated by the set of extractive MLAs 260, which will be explained in more detail herein below.

In one or more embodiments, the server 220 may execute one or more of the set of MLA 250. In one or more alternative embodiments, one or more of the set of MLA 250 may be executed by another server (not depicted), and the server 220 may access the one or more of the set of MLA 250 for training or for use by connecting to the server (not shown) via an API (not depicted), and specify parameters of the one or more of the set of MLA 250, transmit data to and/or receive data from the MLA 250, without directly executing the one or more of the set of MLA 250.

As a non-limiting example, one or more MLAs of the set of MLAs 250 may be hosted on a cloud service providing a machine learning API.

Database

A database 230 is communicatively coupled to the server 220 via the communications network 240 but, in one or more alternative implementations, the database 230 may be communicatively coupled to the server 220 without departing from the teachings of the present technology. Although the database 230 is illustrated schematically herein as a single entity, it will be appreciated that the database 230 may be configured in a distributed manner, for example, the database 230 may have different components, each component being configured for a particular kind of retrieval therefrom or storage therein.

The database 230 may be a structured collection of data, irrespective of its particular structure or the computer hardware on which data is stored, implemented or otherwise rendered available for use. The database 230 may reside on the same hardware as a process that stores or makes use of the information stored in the database 230 or it may reside on separate hardware, such as on the server 220. The database 230 may receive data from the server 220 for storage thereof and may provide stored data to the server 220 for use thereof.

In one or more embodiments of the present technology, the database 230 is configured to inter alia: (i) store a plurality of documents; (ii) store summaries associated with one or more of the plurality of documents; and (iii) store parameters associated with the set of MLAs 250.

Communication Network

In one or more embodiments of the present technology, the communications network 240 is the Internet. In one or more alternative non-limiting embodiments, the communication network 240 may be implemented as any suitable local area network (LAN), wide area network (WAN), a private communication network or the like. It will be appreciated that implementations for the communication network 240 are for illustration purposes only. How a communication link 245 (not separately numbered) between the server 220, the database 230, and/or another electronic device (not shown) and the communications network 240 is implemented will depend inter alia on how each electronic device is implemented.

Figure 3:
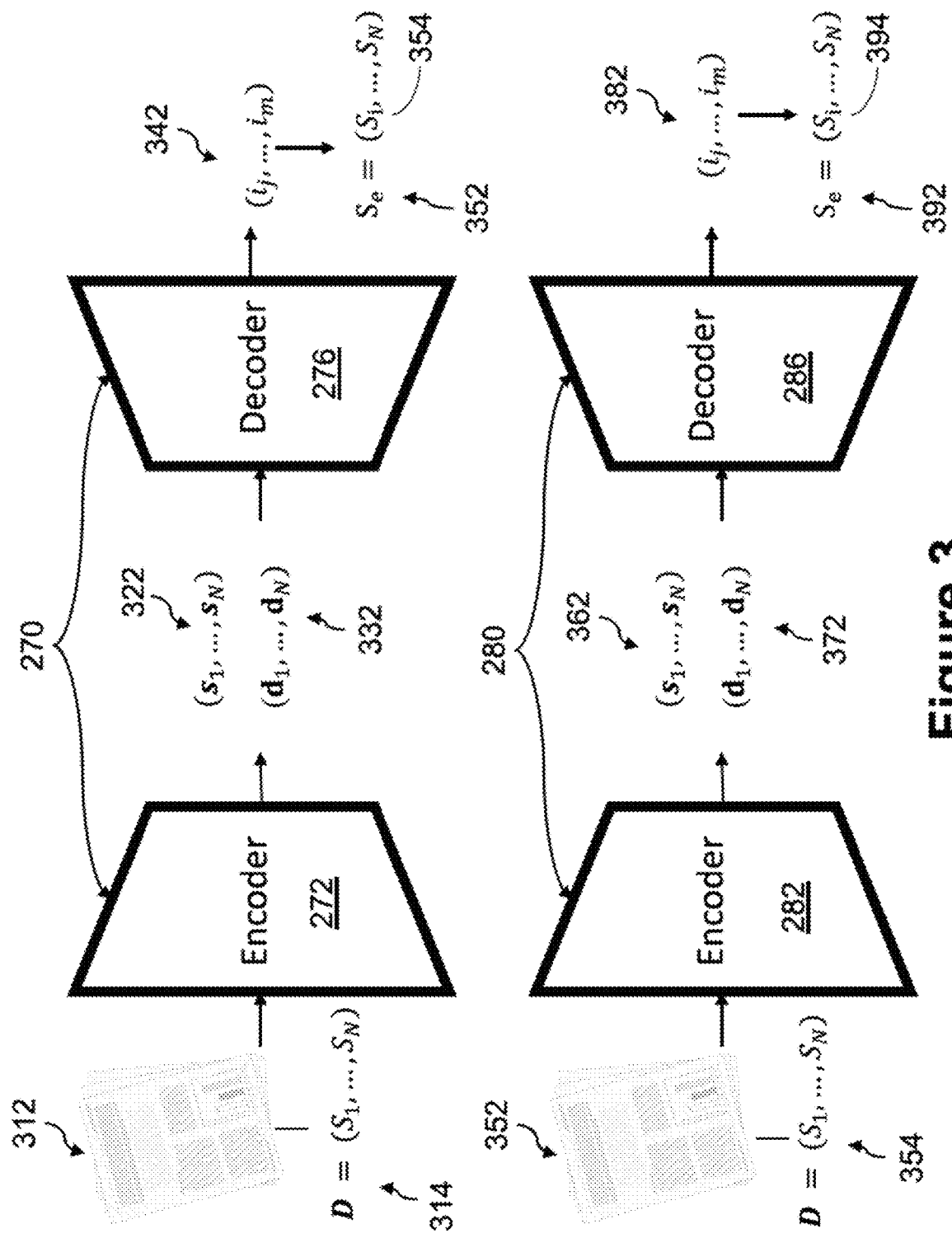
FIG. 3 depicts a schematic diagram of a set of extractive machine learning algorithms (MLAs) in accordance with one or more non-limiting embodiments of the present technology.

With reference to FIG. 3, there is depicted a schematic diagram of the set of extractive MLAs 260 in accordance with one or more non-limiting embodiments of the present technology.

Set of Extractive MLAs

The set of extractive MLAs 260 comprises inter alia a sentence pointer 270, and a sentence classifier 280.

The sentence pointer 270 and the sentence classifier 280 may both be used for generating extractive summaries of documents after a supervised training phase. An extractive summary comprises the most important or relevant sentences or text sequences in a document.

Sentence Pointer

In one or more embodiments, the sentence pointer 270 is implemented as a hierarchical seq2seq sentence pointer.

The sentence pointer 270 comprises an encoder 272, and a decoder 276. It will be appreciated that the encoder 272 may include one or more encoders, and that the decoder 276 may include one or more decoders.

The encoder 272 includes a sentence encoder and a document encoder. In one or more embodiments, the sentence encoder and the document encoder each comprise 2 layers of 512 units.

The encoder 272 receives as an input a document 312 comprising a plurality of text sentences 314. The encoder 272 considers the document 312 as a list of N sentences represented by D=($S_1, \ldots, S_N$), and each sentence of the plurality of text sentences 314 as a list of tokens.

As a non-limiting example, the encoder 272 may uses sub-word units computed using byte pair encoding with 40,000 replacements, and to address memory issues in the sentence pointer 270, 300 sentences may be kept per article, and 35 tokens per sentence.

The sentence encoder or token-level RNN of the encoder 272 is a bi-directional long short term memory (LSTM) network encoding each sentence such that the last hidden state of the last layer from the two directions produces a set of sentence embeddings 322 comprising a sequence of sentences represented by ($s_1, \ldots, s_N$), where N is the number of sentences in the document 312.

In one or more embodiments, the set of sentence embeddings 322 may be generated by creating an index from the words in the plurality of text sentences 314 of the document 312 and projecting the words in a vector space.

The sentence-level LSTM or the document encoder of the encoder 272 includes another bi-directional LSTM which encodes a set of sentence embeddings 322 to produce a set of document representations 332 represented by ($d_1, \ldots, d_N$). The set of document representations 332 is a fixed size representation of the information comprised in the document 312.

The encoder 272 outputs inter alia the set of sentence embeddings 322 and the set of document representations 332.

The decoder 276 includes a LSTM.

In one or more embodiments, the decoder 276 includes an autoregressive LSTM taking the sentence-level LSTM hidden state of the previously extracted sentence as input and predicting the next extracted sentence. For $i_t$, the index of the previous extracted sentence at time step t. In one or more embodiments, the input to the decoder 276 is $s_{i_t}$, or a zero vector at time-step t=0. The decoder 276 output is computed by an attention mechanism from the decoder 276 hidden state $h_t$ over the set of document representations 332 ($d_1, \ldots, d_N$).

In one or more embodiments, the decoder 276 uses a product attention method.

The attention weights $a_t$ produce a context vector $c_t$, which is then used to compute an attention aware hidden state $\tilde{h}_t$. The attention aware hidden state $\tilde{h}_t$ is concatenated to the input in the next time step, resulting in a recurrence expressed as equation (1):

$$h_t = \text{LSTM}([s_{i_t}^T \tilde{h}_{t-1}^T]^T, h_{t-1}) \qquad (1)$$

where the attention aware hidden state $\tilde{h}_t$, the context vector $c_t$ and $a_t(i)$ the dot product between the transposed document representation and the sentence representation are expressed respectively by equations (2-5)

$$\tilde{h}_t = W_{\tilde{h}} \cdot \begin{bmatrix} c_t \\ h \end{bmatrix} \qquad (2)$$

$$c_t = \sum_{o=1}^{N} a_t(i) d_i, \qquad (3)$$

$$\alpha_t(i) = d_i^T h_t \qquad (4)$$

$$a_t(i) = \frac{\exp(\alpha_t(i))}{\sum_1 \exp(\alpha_t(i'))} \text{ for } i = 1..N \qquad (5)$$

The attention weights $a_t$ are used as output probability distribution over the document sentences, of the choice for the next extracted sentence. It will be appreciated that the dot product $a_t(i)$ between the transposed document representation and the sentence representation may be interpreted as how well the document representation aligns with the current hidden state.

In one or more embodiments, the convention to signal the end of the extraction by putting the same index twice in a row is chosen.

The decoder 276 outputs a set of positions 342 of the extracted sentences in the plurality of sentences 314 in the document 312 which are used to form the set of extracted sentences 354.

In one or more embodiments, beam-search is used to generate the extracted summary comprising a set of extracted sentences 354. The set of extracted sentences 354 is a subset of the plurality of sentences 314.

In other words, the sentence pointer 270 is configured to extract sentences from the plurality of sentences 314 of the document 312 based on a document representation thereof, where the sentence pointer 270 makes a decision on which sentences to select for extraction based on sentences having been extracted at previous time steps. Thus, it may be said the sentence pointer 270 takes into account the order of the plurality of sentences 314, i.e. the respective position of each of the plurality of sentences, as well as the number of sentences when selecting sentences for extraction.

Sentence Pointer Training

To generate extractive summaries, the sentence pointer 270 is trained on a set of reference documents (not shown in FIG. 3) associated with a set of reference extractive summaries (not shown in FIG. 3). In one or more embodiments, the set of reference documents and the associated set of reference extractive summaries are generated using the ground truth extractive summary generation procedure 500.

The set of reference extractive summaries is the ground truth or target of the sentence pointer 270, i.e. the sentence pointer 270 is trained to generate extractive summaries from documents by being trained on the set of reference documents and the associated set of reference extractive summaries.

In one or more embodiments, the sentence pointer 270 is trained to minimize the cross-entropy of picking the correct sentence at each decoder time step. It will be appreciated that other loss functions may be used without departing from the scope of the present technology.

During training of the sentence pointer 270, the input to the decoder 276 is the sequence: 0, $s_{i_1}, \ldots, s_{i_M}$, and the target: $i_1, \ldots, i_M, i_M$, where M is the length of the ground-truth extracted summary or reference summary and both sequences have M+1 elements.

The sentence pointer 270 considers the document as a list of N sentences $D=(S_1, \ldots, S_N)$, and each sentence as a list of tokens. The ground-truth extracted summary of M sentences $(S_{i_1}, \ldots, S_{i_M})$, where the $i_1 < \ldots < i_M$ are the indices of the extracted sentences.

As a non-limiting example, the sentence pointer 270 may use word embeddings of size 400. The token-level LSTM (sentence encoder), sentence level LSTM (document encoder) of the encoder 272 and the decoder 274 may each have 2 layers of 512 units and a dropout of 0:5 may be applied at the output of each intermediate layer. As a non-limiting example, the sentence class may be trained with Adam, a learning rate 0:001, a weight decay of $10^{-5}$, and using batch sizes of 32. The model may be evaluated every 200 updates, using a patience of 50.

Sentence Classifier

The sentence classifier 280 includes an encoder 282 and a decoder 286 or classifier 286. It will be appreciated that the encoder 282 may include one or more encoders, and that the decoder 286 may include one or more decoders.

The encoder 282 receives as an input a document 352 comprising a plurality of text sentences 354. The document 352 may be the same as the document 352 or any other type of document the sentence classifier 280 has been trained on.

Similarly to the encoder 272 of the sentence pointer 270, the encoder 282 considers the document 352 as a list of N sentences represented by $D=(S_1, \ldots, S_N)$, and each sentence as a list of tokens. It is contemplated that the encoder 282 may be similar to the encoder 272, however this does not need to be so in every embodiment of the present technology.

In one or more embodiments, the encoder 282 includes a hierarchical LSTM to encode document 352 and produce a set of document representations 372 $d_1, \ldots, d_N$ where N is the number of sentences in the document.

The encoder 282 outputs inter alia a set of sentence embeddings 362 and the set of document representations 372.

The decoder 286 comprises a classifier parametrized by weights and bias.

In one or more embodiments, the decoder 286 computes a final document representation, which is expressed by equation (6):

$$d = \tanh\left(b_d + W_d \cdot \frac{1}{N}\sum_{i=1}^{N} d_i\right) \quad (6)$$

where $b_d$ is a bias matrix and $W_d$ is a weight matrix of the decoder 286, which are learnable parameters during the training of the sentence classifier 280.

The decoder 286 outputs an extractive summary 392 comprising a set of extracted sentences 394, where the probability of each sentence in the document 352 representation belonging to the extractive summary 392 is expressed as equation (7)

$$o_i = \sigma\left(W_o\begin{bmatrix}d_i\\d\end{bmatrix} + b_o\right) \quad (7)$$

where $\sigma$ is a sigmoid activation function.

In other words, the decoder 286 parses document representations to determine if a given sentence of the document 352 should be extracted to be added to the set of extracted sentence 394 of the extractive summary 392 or not, without considering the previously extracted sentences or taking into account order of the plurality of sentences 354.

Sentence Classifier Training

To generate extractive summaries, the sentence classifier 280 is trained on a set of reference documents (not shown in FIG. 3) associated with a set of reference extractive summaries (not shown in FIG. 3). In one or more embodiments, the set of reference documents and the associated set of reference extractive summaries are generated using the ground truth extractive summary generation procedure 500. In one or more embodiments, the sentence classifier 280 is trained on the extractive summaries generated by using the ground truth extractive summary generation procedure 500, where for each sentence in an abstractive summary of a document, the two sentences in the document having the highest similarity score with are selected to generate an extractive summary to be provided as a target to the sentence classifier 280.

In one or more embodiments, the sentence classifier 280 is trained to minimize the binary cross-entropy loss with respect to the sentences in the gold-extracted summary. It will be appreciated that other loss functions may be used to train the sentence classifier 280.

Figure 4:
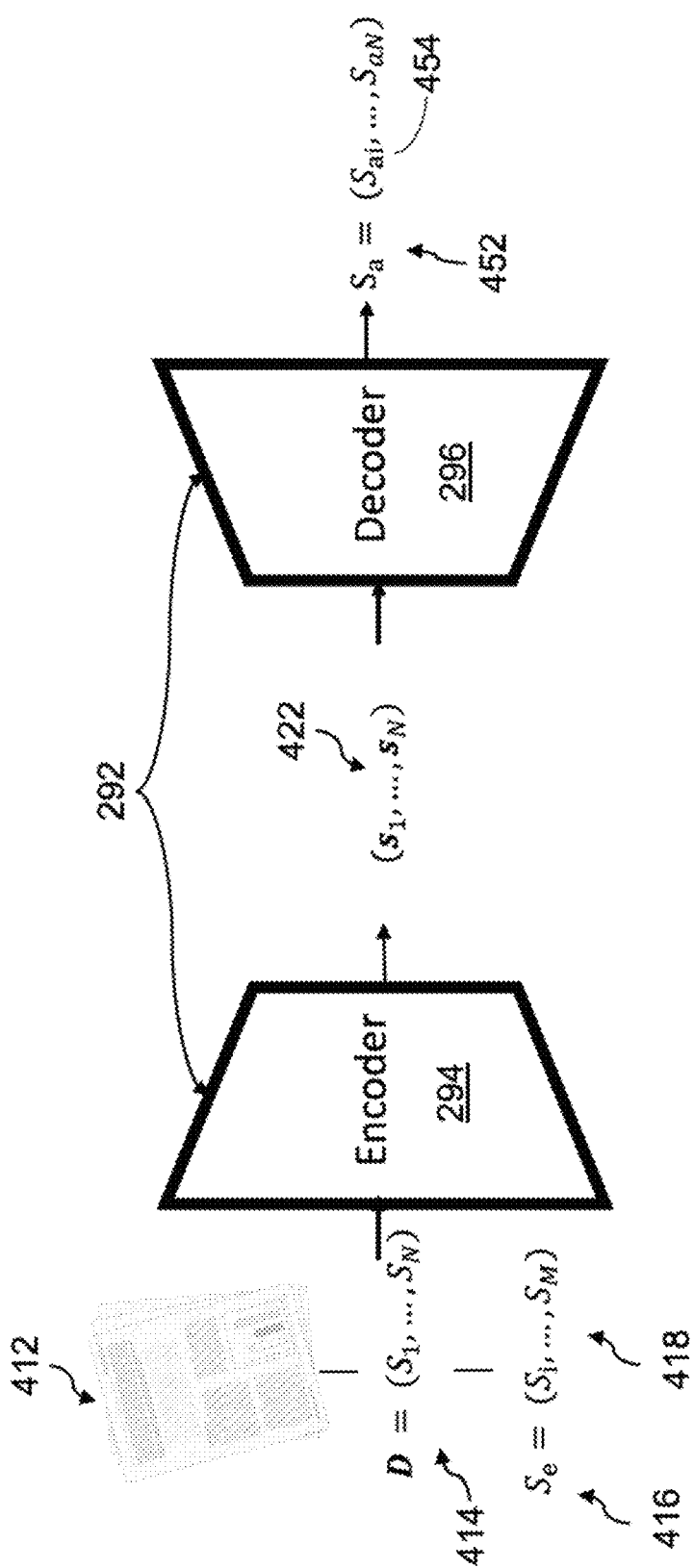
FIG. 4 depicts a schematic diagram of a set of abstractive MLAs in accordance with one or more non-limiting embodiments of the present technology.

With reference to FIG. 4, there is depicted a schematic diagram of the transformer 292 of the set of abstractive MLAs 290 in accordance with one or more non-limiting embodiments of the present technology.

Set of Abstractive MLAs

The set of abstractive MLAs 290 include one or more of transformer language models (TLM), which will be referred to as a transformer 292. In one or more embodiments, the set of abstractive MLAs 290 further includes a recurrent neural network (RNN) (not depicted).

The transformer 292 is a neural network having a sequence-to-sequence architecture or seq2seq, which transforms a given sequence of elements, such as a sequence of words in a sentence, into another sequence of words.

In one or more embodiments, the transformer 292 comprises a single generative pre-trained transformer (GPT)—like transformer based on the OpenAI GPT model.

In one or more embodiments, the transformer 292 includes an encoder 294 and a decoder 296. It will be appreciated that the encoder 294 may include one or more encoders, and that the decoder 296 may include one or more decoders.

The encoder 294 receives as an input a document 412 comprising a plurality of sentences 414. The encoder 294 receives as an input an extractive summary of the document 416 comprising a set of extracted sentences 418. The set of extracted sentences 418 may have been generated by one of the set of extractive MLAs 260 or by undergoing the ground truth extractive summary generation procedure 500 which will be explained herein below.

In one or more embodiments, the document 412 may be provided with markers of different sections included in the document 412.

The encoder 294 takes the input sequence and maps it into a higher dimensional space to obtain an n-dimensional vector 422, which is fed into the decoder 296 which turns it into an output sequence comprising a set of abstractive sentences 454 which form the abstractive summary 452. The transformer 292 uses an attention-mechanism that looks at an input sequence and decides at each step which other parts of the sequence are important. For each input that the encoder 294 reads, the attention-mechanism takes into account several other inputs at the same time and decides which ones are important by attributing different weights to those inputs. The encoder 294 will then take as input the encoded sentence and the weights provided by the attention-mechanism.

The encoder 294 comprises a stack of identical layers, where each layer has two sub-layers. The first is a multi-head self-attention mechanism, and the second is a position wise fully connected feed-forward network. Residual connection is employed around each of the two sub-layers, followed by layer normalization. The output of each sub-layer is Layer-Norm(x+Sublayer(x)), where Sublayer(x) is the function implemented by the sub-layer itself. As a non-limiting example, the encoder 294 may comprise a stack of 6 layers.

The decoder 296 comprises a stack of identical layers. In addition to the two sub-layers in each layer of the encoder 294, the decoder 296 inserts a third sub-layer, which performs multi-head attention over the output of the encoder 294 stack. In one or more embodiments, similarly to the encoder 294, residual connections around each of the sub-layers are employed, followed by layer normalization. The self-attention sub-layer in the decoder 296 stack is modified to prevent positions from attending to subsequent positions. This masking, combined with fact that the output embeddings are offset by one position, ensures that the predictions for position i can depend only on the known outputs at positions less than i. It will be appreciated that there may be alternatives to the type of masking and how the mask is created, however it should be noted that the mechanism of adding masks to diminish or null the attention weights on the masked portions of a sequence could only be removed if the input is expanded quadratically (an input on N words (1 row and N columns) would need an N^2 input sequence with N rows and N columns) and the input sequence is padded to simulate left-to-right decoding. In one or more alternative embodiments, the attentions may be found via convolution kernels.

In one or more embodiments, layer normalization is moved to the input of each sub-block, and an additional layer normalization is added after the final self attention block. Additionally, a modified initialization accounting for the accumulation on the residual path with model depth is used.

An attention function maps a query and a set of key-value pairs to an output, where the query, keys, values, and output are all vectors. The output is computed as a weighted sum of the values, where the weight assigned to each value is computed by a compatibility function of the query with the corresponding key.

In one or more embodiments, the transformer 292 may be a pretrained network. In one or more embodiments, when dealing with extremely long documents that may not fit into a single window of tokens seen by the transformer 292, such as an entire scientific article, the introduction of such long documents are used as a proxy for having enough information to generate a summary and use the remainder of the paper as in domain language model training data.

The transformer 292 outputs an abstractive summary 452 comprising a set of abstractive sentences 454. The set of abstractive sentences 454 provide a summary of the document 412, where at least a portion of the set of abstractive sentences 545 are not present in the document 412, i.e. the set of abstractive sentences 454 is not a subset of the plurality of sentences 414. However, it will be appreciated that one or more sentences in set of abstractive sentences 454 may be present in the plurality of sentences 414.

The set of abstractive sentences 454 thus paraphrase important or relevant content present in the document 412, similar to how a human would write a summary.

It will be appreciated that metrics known in the art and/or human assessors may be used to evaluate the performance of the transformer 292.

Abstractive MLA Training

The transformer 292 undergoes a training phase using training documents comprising a set of extractive summaries of the training documents, the set of extractive summaries having been generated by one of the set of extractive MLAs 260, and a set of ground truth abstractive summaries, which may have been generated by one or more humans. As a non-limiting example, the ground truth abstractive summary for training the transformer 292 may include abstracts of the scientific articles and/or patent publications.

In one or more embodiments, the set of extractive summaries may have been generated via the ground truth extractive summary generation procedure 500, which will be described herein below with reference to FIG. 5.

During training, the transformer 292 is conditioned on inter alia the ground truth abstractive summary and the extractive summary.

In order to get the transformer 292 to do abstractive summarization, the assumption that language models are trained by factorizing the joint distribution over words autoregressively is used.

The training data is organized such that the ground-truth summary follows the information used by the transformer 292 to generate a system summary, where the joint distribution of document and summary is modelized during training. At inference, the conditional distribution of summary given document is sampled.

In one or more embodiments, training documents provided to the transformer 292, such as scientific articles or patent publications, may be organized as follows: (i) paper introduction (ii) extracted sentences using one of the set of extractive MLAs 260; (iii) abstract of the training document, which is the target for the transformer 292; and (iv) rest of the document.

In one or more embodiments, the document introduction would be the entire document and no rest of the document is provided, which ensures that at inference, the transformer 292 is provided with the paper introduction and the extracted sentences as conditioning to generate its abstract.

Developers have appreciated that using the ground truth extracted sentences during training and the model extracted sentences at inference performed better than using the model extracted sentences everywhere.

In one or more embodiments, a special token may be used to indicate the start of the summary and at test time to signal to the model to start generating the summary.

As a non-limiting example, in one or more embodiments, the transformer 292 has 220M parameters with 20 layers, 768 dimensional embeddings, 3072 dimensional position-wise multilayer perceptrons (MLPs) and 12 attention heads. Weight may not be not scaled at initialization. The transformer 292 may be trained for 5 days on 16 V100 GPUs on a single Nvidia DGX-2 box. A linear ramp-up learning rate schedule may be used for the first 40,000 updates, to maximum learning rate of $2.5 \times 10^{-4}$ followed by a cosine annealing schedule to 0 over the next 200,000 steps with the Adam optimizer. A mixed-precision training may be used with a batch size of 256 sequences of 1024 tokens each.

Ground Truth Extractive Summary Generation Procedure

Figure 5:
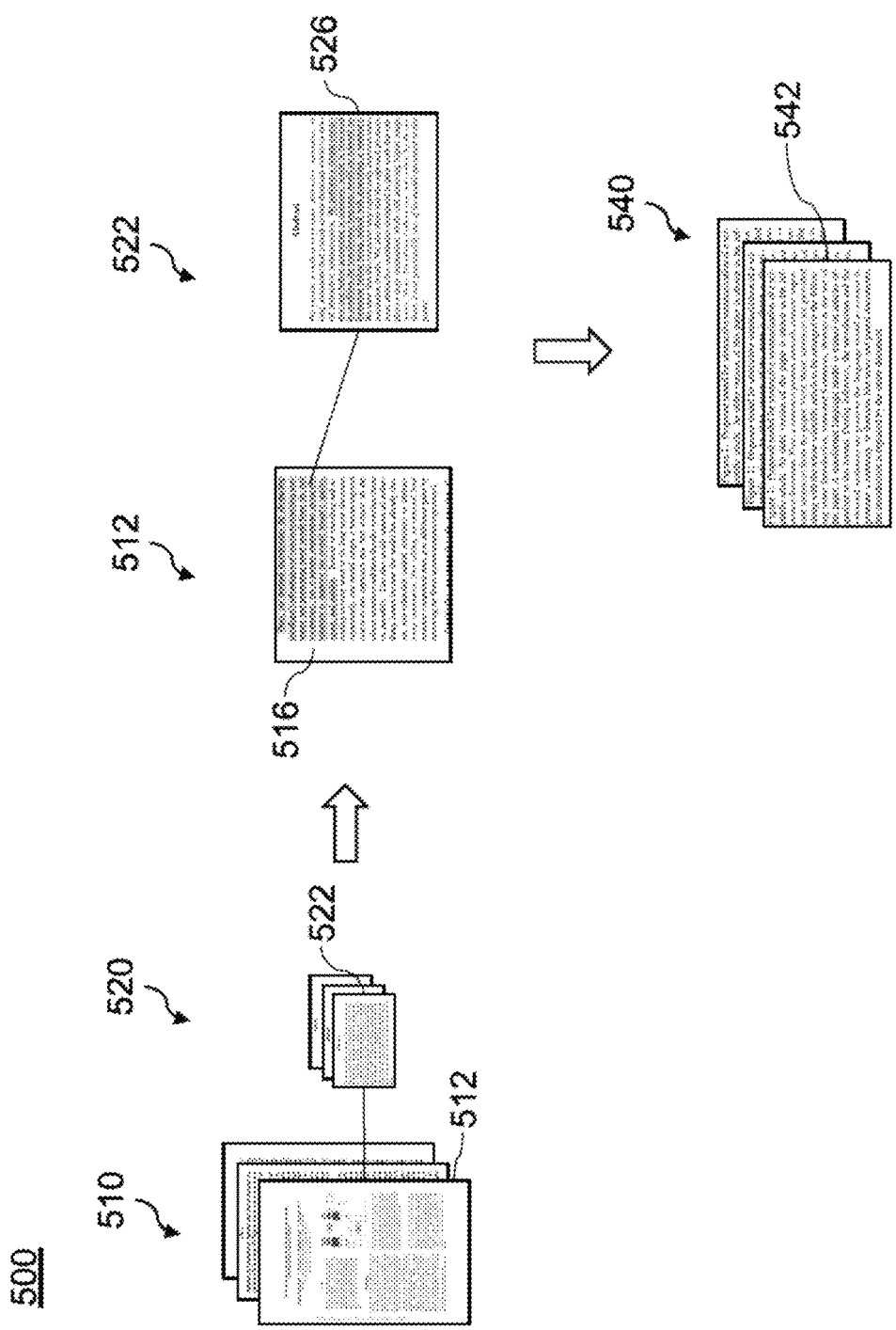
FIG. 5 depicts a schematic diagram of a ground truth extractive summary generation procedure in accordance with one or more non-limiting embodiments of the present technology.

With reference to FIG. 5 there is shown a schematic diagram of a ground truth extractive summary generation procedure 500 in accordance with one or more non-limiting embodiments of the present technology.

The ground truth extractive summary generation procedure 500 is executed by the server 220.

The ground truth summary generation procedure 500 is configured to: (i) receive a set of reference documents 510; (ii) receive a set of summaries 520 including a respective summary 522 for each reference document 512 in the set of reference documents 510; (iii) compare each respective reference document 512 with its respective summary 522; and (iv) generate, for each respective reference document 512, based on the comparison, a ground truth extractive summary 542 to obtain a set of reference extractive summaries 450.

The purpose of the ground truth summary generation procedure 500 is to generate ground truth extractive summaries or reference extractive summaries of documents for training the set of extractive MLAs 260. The ground truth summary generation procedure 500 uses summaries of documents, which are generally abstractive summaries that may have been generated by humans and/or machine learning models, as a proxy to generate extractives summaries for training the set of extractive MLAs 260. Since abstractive summaries of documents may include content that has been at least partially rephrased, i.e. may not include sentences originally present in the document while conveying the same meaning, the ground truth summary generation procedure 500 aims to find sentences in the document 512 that are the closest to the sentences in the summary 522 such that the sentences may serve as examples of extractive sentences for training the set of extractive MLAs 260.

It will be appreciated that in instances where a sufficient number of documents have extractive summaries for training the set of extractive MLAs 260, the ground truth summary generation procedure 500 may be optional.

The ground truth summary generation procedure 500 receives a set of reference documents 510. The nature of a document in the set of documents is not limited, and may include any document including a plurality of text sequences. Non-limiting examples of documents include news articles, web pages, scientific articles, patent publications, and the like.

In one or more embodiments, the ground truth summary generation procedure 500 receives the set of reference documents 510 from the database 230. In one or more alternative embodiments, the ground truth summary generation procedure 500 may receive the set of reference documents 510 from another electronic device (not shown) over the communication network 240.

The ground truth summary generation procedure 500 receives a set of summaries 520 associated with the set of reference documents 510, where each respective summary 522 is a summary of a respective reference document 512 in the set of reference documents 510. The ground truth summary generation procedure 500 receives the associated set of summaries 520 from the database 230. The set of summaries 520 may be received at the same time as the set of reference documents 510 or at a different time. It is contemplated that in instances where the respective reference document 512 includes a summary, the respective summary 522 may be extracted from the respective reference document 512.

The ground truth summary generation procedure 500 compares each respective reference document 512 of the set of reference documents 510 with the respective summary 522 of the set of summaries 520.

During the comparison, the ground truth summary generation procedure 500 is configured to determine, for each summary sentence 526 in the respective summary 522, a similar reference document sentence 516 present in the reference document 512.

In one or more embodiments, the ground truth summary generation procedure 500 may parse each sentence in the reference document 512 to determine a similarity score between the sentence and each summary sentence 526.

The manner in which the similarity between a summary sentence 526 from the summary 522 and a document reference sentence 516 from the reference document 512 is determined is not limited. In one or more embodiments, the ground truth summary generation procedure 500 may use specific sentence features such as, but not limited to keywords, position, length, frequency, linguistic and metrics such as, but not limited to structure-based, vector-based and graph-based metrics.

In one or more alternative embodiments, the ground truth summary generation procedure 500 may embed the respective document and the associated respective summary by accessing a machine learning algorithm (not illustrated) to obtain vectors representations thereof, and may determine a similarity score between sentences based on a distance between vector representations of sentences.

As a non-limiting example, the ground truth summary generation procedure 500 may use a Recall-Oriented Understudy for Gisting Evaluation (ROUGE) score to determine if a sentence in the respective reference document 512 is similar to a sentence in the respective summary 522. As another non-limiting example, the ground truth summary generation procedure 500 uses a BLEU score to determine if a sentence in the respective document is similar to a sentence in the respective summary. As another non-limiting example, the ground truth summary generation procedure 500 may use a cosine similarity to determine the similarity score.

In one or more embodiments, for each summary sentence 526 from the summary 522, the ground truth summary generation procedure 500 extracts two sentences in the reference document 512 having the highest similarity score to generate the reference extractive summary 542 e.g. if the summary 522 has four sentences, two sentences may be selected for each of the four sentences to obtain eight sentences in the reference extractive summary 542. It is contemplated that the ground truth summary generation procedure 500 may select less or more than two sentences in the reference document 512 for each summary sentence 526 from the summary 522.

Additionally or alternatively, the ground truth summary generation procedure 500 may select sentences from the reference document 512 based on a threshold similarity score.

The ground truth summary generation procedure 500 outputs, for each reference document 512 of the set of reference documents 510, the reference extractive summary 542 to obtain a set of reference extractive summaries 540.

The set of reference extractive summaries 540 may then be used for training the set of extractive MLAs 260 and the set of abstractive MLAs 290.

Figure 6:
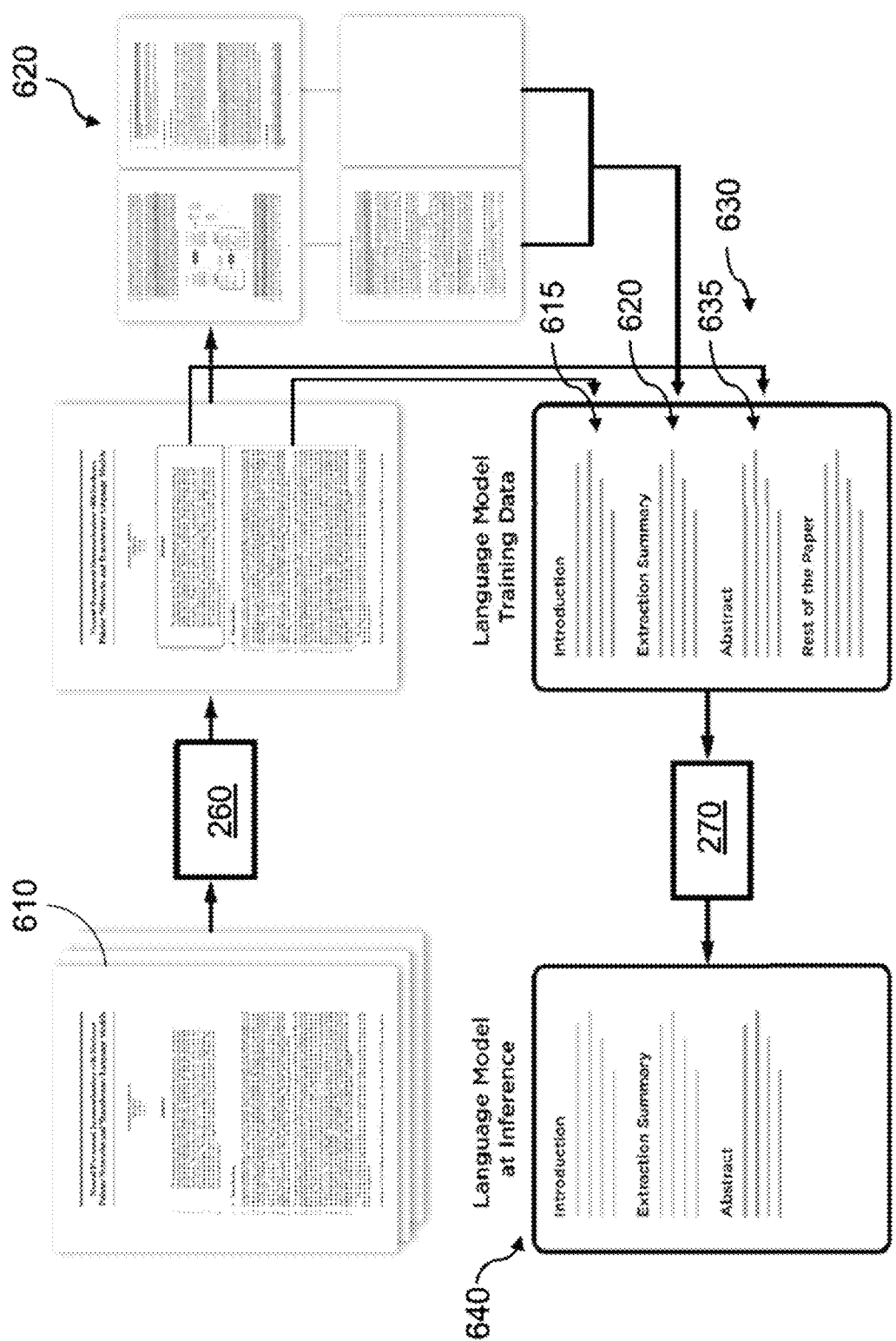
FIG. 6 depicts a schematic diagram of the set of extractive MLAs and of the set of abstractive MLAs and inputs and outputs thereof in accordance with one or more non-limiting embodiments of the present technology.

FIG. 6 depicts a schematic diagram of inputs and outputs of the set of extractive MLAs 260 and the set of abstractive MLAs 290 in accordance with one or more non-limiting embodiments of the present technology.

It will be appreciated that the set of extractive MLAs 260 depicted in FIG. 6 may be the sentence pointer 270 or the sentence classifier 280. It will be appreciated that the set of abstractive MLAs 290 may be the transformer 292 or a RNN.

First, one of the set of extractive MLAs 260 extracts important sentences from the document 610 to obtain an extractive summary 620 of the document 610. As a non-limiting example, the document 610 may be a scientific article including thousands of words.

In one or more embodiments, the document 610 may be selected based on a size threshold so as to train the set of abstractive MLAs 290 to generate abstractive summaries of longer documents, i.e. having a size or a number of words above a predetermined threshold.

A training document 630 is then generated based on the document 610 and the extractive summary 620. In one or more embodiments, the training document 630 is generated based on sections present in the document 610.

In one or more embodiments, the training document 630 comprises an introduction 615, an extractive summary 620, an abstract 635 and the remainder of the document 630. It will be appreciated that the abstract 635 may be an abstract section of a scientific article or a document having been generated by a human.

The same procedure may be repeated to obtain a sufficient number of training documents for training one of the set of abstractive MLAs 290.

The set of abstractive MLAs 290 is then trained on training documents having the same organization as the training document 630. The abstract 635 is used as the ground truth for generating an abstractive summary.

During inference, the set of abstractive MLAs 290 receive as an input a document 640, which comprises an introduction and an extractive summary generated by the set of extractive MLAs 260, to provide context to one of the set of abstractive MLAs 290 for generating an abstractive summary. In one or more embodiments where the document 640 is above a predetermined size threshold, at least a portion of the document 640 is also provided as an input with the extractive summary and the introduction.

Method Description

Figure 7:
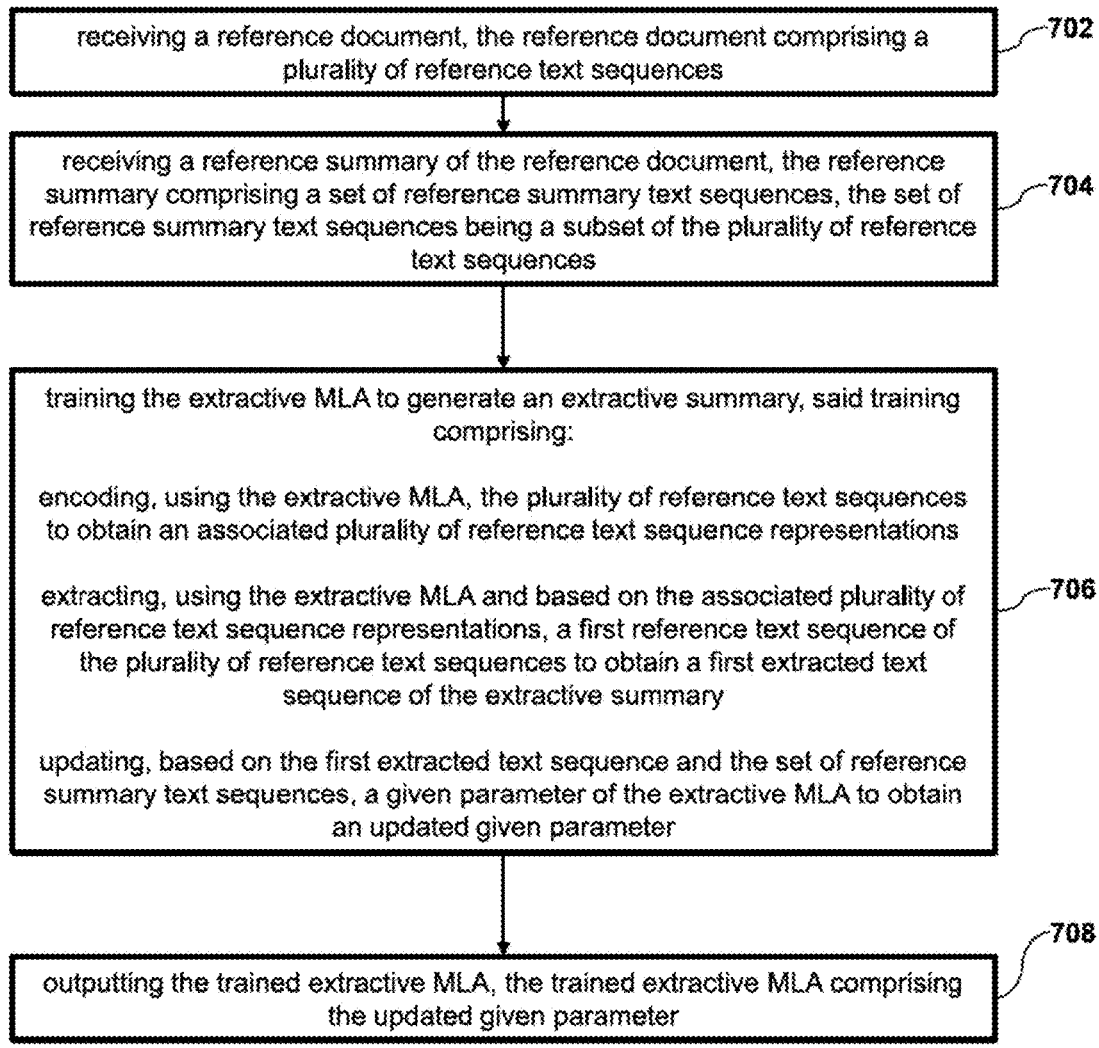
FIG. 7 depicts a flow chart of a method of training an extractive MLA in accordance with one or more non-limiting embodiments of the present technology.

FIG. 7 depicts a flowchart of a method 700 of training an extractive machine learning algorithm (MLA), the method 700 being executed in accordance with one or more non-limiting embodiments of the present technology.

The server 220 comprises a processor 110 and a non-transitory computer readable storage medium such as the solid-state drive 120 and/or the random-access memory 130 storing computer-readable instructions. The processor 110, upon executing the computer-readable instructions, is configured to execute the method 700. It is contemplated that other processing units such as the GPU 111 may execute the method 700.

The server 220 has access to the set of MLAs 250, comprising a set of extractive MLAs 260. The set of extractive MLAs 260 comprises the sentence pointer 270 and the sentence classifier 280. The method 700 may be executed for training the sentence pointer 270 and/or the sentence classifier 280.

The method 700 begins at processing step 702.

According to processing step 702, the processor 110 receives a reference document, the reference document comprising a plurality of reference text sequences.

In one or more embodiments, prior to processing step 702, the processor 110 receives a size of the plurality of reference text sequences and receiving the reference document is in response to the size of the plurality of reference text sequences being above a predetermined threshold.

According to processing step 704, the processor 110 receives a reference summary of the reference document, the reference summary comprising a set of reference summary text sequences, the set of reference summary text sequences being a subset of the plurality of reference text sequences. It will be appreciated that the reference summary may be represented as an array indicating the positions of each text sequence of the reference summary in the reference document.

In one or more embodiments, the reference summary is an extractive summary of the reference document.

In one or more other embodiments, the reference summary is generated by the processor 110 by receiving a first summary of the reference document, the first summary comprising a set of first summary text sequences, where at least one first summary text sequence not being included in the plurality of reference text sequences. The first summary may be an abstractive summary of the reference document having been generated by a human. The processor 110 determines a respective similarity score between the at least one first summary text sequence and at least one reference text sequence of the plurality of reference text sequences, and extracts, based on the respective similarity score being above a threshold, the at least one reference text sequence of the plurality of reference text sequences to obtain the reference summary of the reference document. In one or more embodiments, the respective similarity score is determined based on a Recall-Oriented Understudy for Gisting Evaluation (ROUGE) metric.

According to processing step 706, the processor 110 trains the extractive MLA to generate an extractive summary. The extractive MLA comprises an encoder 272, 282 and a decoder 276, 286. The encoder 272, 282 comprises a long short term memory (LSTM) network.

In one or more embodiments where the extractive MLA is implemented as the sentence pointer 270, the decoder 276 comprises another LSTM network.

In one or more embodiments, where the extractive MLA is implemented as the sentence classifier 280, the decoder 286 comprises a classifier.

The training comprises encoding, using the encoder 272, 282 of the extractive MLA, the plurality of reference text sequences to obtain an associated plurality of reference text sequence representations.

In one or more embodiments, the processor 110 embeds, using the encoder 272, 282 of the extractive MLA, the plurality of reference text sequences to obtain a plurality of reference text sequence vectors, and encodes the plurality of reference text sequences to obtain the associated plurality of text sequence representations based on the plurality of reference text sequence vectors.

The training comprises extracting, using the encoder 272, 282 of the extractive MLA and based on the associated plurality of reference text sequence representations, a first reference text sequence of the plurality of reference text sequences to obtain a first extracted text sequence of the extractive summary.

The training comprises updating, based on the first extracted text sequence and the set of reference summary text sequences, a given parameter of the extractive MLA to obtain an updated given parameter. The parameters of the extractive MLA are updated based on a loss calculated using a loss function.

Processing step 706 is repeated until a predetermined number of text sequences are extracted from the plurality of reference text sequences to obtain the extractive summary.

In one or more embodiments where the extractive MLA is implemented as the sentence pointer 270, each reference text sequence of the plurality of reference text sequences is extracted based on the previously extracted sentence to obtain the extractive summary. In one or more embodiments, the extracting is based on a position of each of the plurality of reference text sequences.

In one or more embodiments where the extractive MLA is implemented as the sentence classifier 280, each reference text sequence is extracted without considering the position or order of the plurality of reference text sequences.

Processing steps 702 to 706 are repeated iteratively for a set of reference documents until convergence.

According to processing step 708, the processor 110 outputs the trained extractive MLA.

The method 700 ends.

Figure 8:
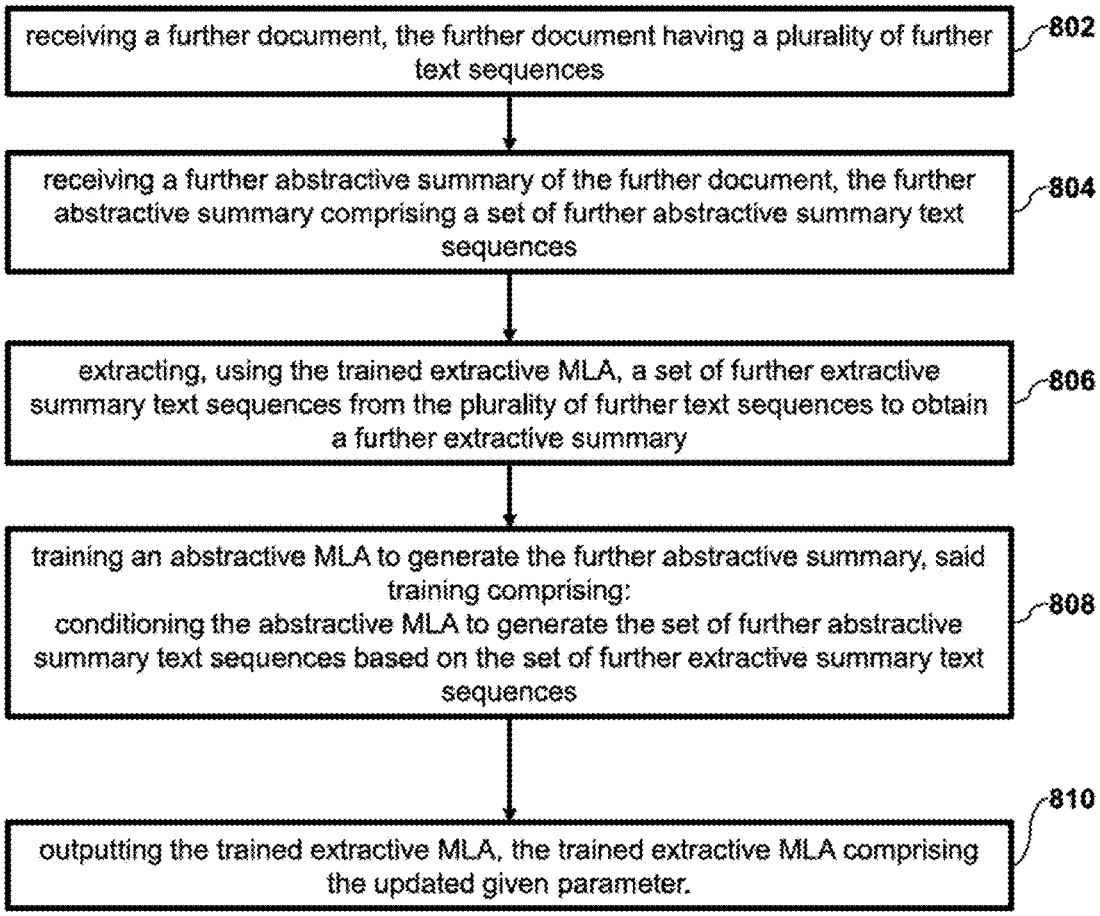
FIG. 8 depicts a flow chart of a method of training an abstractive MLA in accordance with one or more non-limiting embodiments of the present technology.

FIG. 8 depicts a flowchart of a method 800 of training an abstractive MLA, the method 800 being executed in accordance with one or more non-limiting embodiments of the present technology.

The server 220 comprises a processor 110 and a non-transitory computer readable storage medium such as the solid-state drive 120 and/or the random-access memory 130 storing computer-readable instructions. The processor 110, upon executing the computer-readable instructions, is configured to execute the method 800. It is contemplated that other processing units such as the GPU 111 may execute the method 800.

The server 220 has access to the set of MLAs 250 comprising the set of extractive MLAs 260 and the set of abstractive MLAs 290. The set of abstractive MLAs 290 comprises the transformer 292.

In one or more embodiments, the method 800 is executed after the method 700, i.e. after training one of the sentence pointer 270, and the sentence classifier 280 of the set of extractive MLAs 260.

The method 800 begins at processing step 802.

According to processing step 802, the processor 110 receives a further document 312, the further document 312 having a plurality of further text sequences 314. The set of extractive MLAs 260 may not have been trained on the further document 312.

According to processing step 804, the processor 110 receives a further abstractive summary of the further document 312, the further abstractive summary comprising a set of further abstractive summary text sequences. At least a portion of the set of further abstractive summary text sequences is not included in the plurality of further text sequences 314.

In one or more embodiments, the further abstractive summary has been generated by a human.

The further abstractive summary is used as a target for training the set of abstractive MLAs 290.

According to processing step 806, the processor 110 extracts, using the trained extractive MLA, a set of further extractive summary text sequences from the plurality of further text sequences to obtain a further extractive summary. The set of further extractive summary text sequences may be the set of extracted sentences 354.

According to processing step 808, the processor 110 trains the abstractive MLA to generate the further abstractive summary by conditioning the abstractive MLA to generate the set of further abstractive summary text sequences based on the set of further extractive summary text sequences.

In one or more embodiments, the processor 110 trains the abstractive MLA further based on the further document 312 having the plurality of further text sequences 314.

According to processing step 810, the processor 110 outputs the trained abstractive MLA.

The method 800 ends.

Once one of the set of extractive MLAs 260 and one of the set of abstractive MLAs 290 have been trained after execution of the method 700 and the method 800 respectively, an abstractive summary of a given document may be generated by using the one of the set of extractive MLAs 260 to generate an extractive summary, and by using the one of the set of abstractive MLAs 290 on the extractive summary and at least a portion of the given document to generate the abstractive summary.

It will be appreciated that not all technical effects mentioned herein need to be enjoyed in each and every embodiment of the present technology. For example, one or more embodiments of the present technology may be implemented without the user enjoying some of these technical effects, while other non-limiting embodiments may be implemented with the user enjoying other technical effects or none at all.

Some of these steps and signal sending-receiving are well known in the art and, as such, have been omitted in certain portions of this description for the sake of simplicity. The signals can be sent-received using optical means (such as a fiber-optic connection), electronic means (such as using wired or wireless connection), and mechanical means (such as pressure-based, temperature based or any other suitable physical parameter based).

Modifications and improvements to the above-described implementations of the present technology may become apparent to those skilled in the art. The foregoing description is intended to be exemplary rather than limiting.

What is claimed is:

1. A method for training an extractive machine learning algorithm (MLA) to generate extractive summaries of text documents, the method being executed by a processor, the processor having access to the extractive MLA, the extractive MLA comprising a sentence encoder, a document encoder and a decoder, the method comprising:
   receiving a given reference document, the given reference document comprising a plurality of reference sentences;
   receiving a reference summary of the given reference document, the reference summary comprising a set of reference summary sentences, the set of reference summary sentences being a subset of the plurality of reference sentences of the given reference document;
   training the extractive MLA to generate an extractive summary, said training comprising:

encoding, using the sentence encoder, the plurality of reference sentences to obtain an associated plurality of reference sentence representations;

encoding, using the document encoder, the associated plurality of reference sentence representations to obtain a document representation;

extracting, using the decoder and based on the associated plurality of reference sentence representations and the document representation, a first reference sentence of the plurality of reference sentences to obtain a first extracted sentence of the extractive summary; and updating, based on the first extracted sentence and the set of reference summary sentences, a given parameter of the extractive MLA to obtain an updated given parameter; and outputting the trained extractive MLA, the trained extractive MLA comprising the updated given parameter.

2. The method of claim 1, wherein said training is performed on a set of reference documents by using an associated set of reference summaries as a target, the set of reference documents comprising the given reference document and the set of reference summaries comprising the reference summary.

3. The method of claim 2, further comprising, prior to said receiving the reference summary of the given reference document, the reference summary comprising the set of reference summary sentences:

receiving a first summary of the given reference document, the first summary comprising a set of first summary sentences, at least one first summary sentence not being included in the plurality of reference sentences;

determining a respective similarity score between the at least one first summary sentence and at least one reference sentence of the plurality of reference sentences; and extracting, based on the respective similarity score, the at least one reference sentence of the plurality of reference sentences to obtain the reference summary of the given reference document.

4. The method of claim 3, further comprising, prior to said receiving the given reference document comprising the plurality of reference sentences:

receiving a size of the plurality of reference sentences; and wherein said receiving the given reference document comprising the plurality of reference sentences is in response to the size of the plurality of reference sentences being above a predetermined threshold.

5. The method of claim 4, wherein the sentence encoder and the document encoder each comprises a respective bi-directional long short term memory (LSTM) network.

6. The method of claim 5, wherein the decoder comprises an autoregressive LSTM.

7. The method of claim 6, further comprising, after said extracting, using the decoder and based on the associated plurality of reference sentence representations and the document representation, the first extracted sentence of the set of reference summary sentences:

extracting, using the decoder, based on the first extracted sentence and the associated plurality of sentence representations, a second first reference sentence of the plurality of reference sentences to obtain a second extracted sentence of the extractive summary.

8. The method of claim 7, wherein said generating is performed recursively.

9. The method of claim 8, wherein
the decoder comprises a hidden state, the hidden state comprising the first extracted sentence and the associated plurality of sentence representations; and wherein said extracting comprises using an attention mechanism on the hidden state of the decoder over a set of document representations comprising the document representation to obtain the extractive summary comprising the first extracted sentence and the second extracted sentence.

10. The method of claim 1, wherein said training comprises minimizing a cross-entropy of picking a correct sentence at each decoder time step.

11. A system for training an extractive machine learning algorithm (MLA) to generate extractive summaries, the system comprising:

a processor;

a non-transitory storage medium operatively connected to the processor, the non-transitory storage medium comprising computer readable instructions; and the processor having access to the extractive MLA, the extractive MLA comprising a sentence encoder, a document encoder and a decoder, the processor, upon executing the computer readable instructions, being configured for:

receiving a given reference document, the given reference document comprising a plurality of reference sentences;

receiving a reference summary of the given reference document, the reference summary comprising a set of reference summary sentences, the set of reference summary sentences being a subset of the plurality of reference sentences of the given reference document;

training the extractive MLA to generate an extractive summary, said training comprising:

encoding, using the sentence encoder, the plurality of reference sentences to obtain an associated plurality of reference sentence representations;

encoding, using the document encoder, the associated plurality of reference sentence representations to obtain a document representation;

extracting, using the decoder and based on the associated plurality of reference sentence representations and the document representation, a first reference sentence of the plurality of reference sentences to obtain a first extracted sentence of the extractive summary; and updating, based on the first extracted sentence and the set of reference summary sentences, a given parameter of the extractive MLA to obtain an updated given parameter; and outputting the trained extractive MLA, the trained extractive MLA comprising the updated given parameter.

12. The system of claim 11, wherein said training is performed on a set of reference documents by using an associated set of reference summaries as a target, the set of reference documents comprising the given reference document and the set of reference summaries comprising the reference summary.

13. The system of claim 12, wherein the processor is further configured for, prior to said receiving the reference summary of the given reference document, the reference summary comprising the set of reference summary sentences:

receiving a first summary of the given reference document, the first summary comprising a set of first summary sentences, at least one first summary sentence not being included in the plurality of reference sentences;

determining a respective similarity score between the at least one first summary sentence and at least one reference sentence of the plurality of reference sentences; and extracting, based on the respective similarity score, the at least one reference sentence of the plurality of reference sentences to obtain the reference summary of the given reference document.

14. The system of claim 13, wherein the processor is further configured for, prior to said receiving the given reference document comprising the plurality of reference sentences:

receiving a size of the plurality of reference sentences; and wherein said receiving the given reference document comprising the plurality of reference sentences is in response to the size of the plurality of reference sentences being above a predetermined threshold.

15. The system of claim 14, wherein the sentence encoder and the document encoder each comprises a respective bi-directional long short term memory (LSTM) network.

16. The system of claim 15, wherein the decoder comprises an autoregressive LSTM.

17. The system of claim 16, wherein the processor is further configured for, after said extracting, using the decoder and based on the associated plurality of reference sentence representations and the document representation, the first extracted sentence of the set of reference summary sentences:

extracting, using the decoder, based on the first extracted sentence and the associated plurality of sentence representations, a second first reference sentence of the plurality of reference sentences to obtain a second extracted sentence of the extractive summary.

18. The system of claim 17, wherein said generating is performed recursively.

19. The system of claim 18, wherein the decoder comprises a hidden state, the hidden state comprising the first extracted sentence and the associated plurality of sentence representations; and wherein said extracting comprises using an attention mechanism on the hidden state of the decoder over a set of document representations comprising the document representation to obtain the extractive summary comprising the first extracted sentence and the second extracted sentence.

20. The system of claim 19, wherein said training comprises minimizing a cross-entropy of picking a correct sentence at each decoder time step.

* * * * *